(12) United States Patent
Cheng et al.

(10) Patent No.: US 9,520,453 B2
(45) Date of Patent: Dec. 13, 2016

(54) ELECTROLUMINESCENT DEVICE AND MANUFACTURING METHOD THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/416,904

(22) PCT Filed: Jun. 26, 2014

(86) PCT No.: PCT/CN2014/080898
§ 371 (c)(1),
(2) Date: Jan. 23, 2015

(87) PCT Pub. No.: WO2015/039482
PCT Pub. Date: Mar. 26, 2015

(65) Prior Publication Data
US 2015/0325632 A1 Nov. 12, 2015

(30) Foreign Application Priority Data
Sep. 23, 2013 (CN) .......................... 2013 1 0436180

(51) Int. Cl.
*H01L 27/32* (2006.01)
*H01L 51/00* (2006.01)

(52) U.S. Cl.
CPC ....... *H01L 27/3258* (2013.01); *H01L 27/3248* (2013.01); *H01L 27/3253* (2013.01);
(Continued)

(58) Field of Classification Search
CPC ............. H01L 51/0024; H01L 27/3248; H01L 27/3258; H01L 27/3253
See application file for complete search history.

(56) References Cited

U.S. PATENT DOCUMENTS

2001/0025959 A1* 10/2001 Yamazaki ............. H01L 27/124
  257/72
2003/0124764 A1* 7/2003 Yamazaki ................ B05D 1/60
  438/99
(Continued)

FOREIGN PATENT DOCUMENTS

CN      1403856 A     3/2003
CN      1638575 A     7/2005
(Continued)

OTHER PUBLICATIONS

International Search Report and Written Opinion of the International Searching Authority with Notice of Transmittal of the International Search Report and Written Opinion of PCT/CN2014/080898 in Chinese, mailed Sep. 23, 2014.
(Continued)

*Primary Examiner* — Mohammad Islam
*Assistant Examiner* — Christina Sylvia
(74) *Attorney, Agent, or Firm* — Collard & Roe, P.C.

(57) ABSTRACT

An electroluminescent device and manufacturing method thereof are provided. The electroluminescence device comprises an array substrate (10). The array substrate (10) comprises a substrate (11); and a thin film transistor (12), a protection layer (13) and a connection electrode (14) provided in turn on the substrate (11). The protection layer (13) covers the thin film transistor (12); and the connection electrode (14) is provided on the protection layer (13). The protection layer (13) below the connection electrode (14) protrudes towards a side away from the substrate (11) to form a boss (131). The protection layer (13) comprises a via hole (132) provided at a position corresponding to a drain electrode (122) of the thin film transistor (12). The connection electrode (14) is connected with the drain electrode (122) of the thin film transistor (12) through the via hole (132). The electroluminescent device and manufacturing
(Continued)

method thereof shorten the film formation time, reduce the etching difficulty and accordingly improves the production efficiency in the process of manufacturing the connection electrode while the reliability of electrical connection between a thin film transistor and a second electrode is improved.

19 Claims, 5 Drawing Sheets

(52) U.S. Cl.
CPC ........ *H01L 51/0024* (2013.01); *H01L 27/322* (2013.01); *H01L 2227/323* (2013.01); *H01L 2251/301* (2013.01); *H01L 2251/558* (2013.01)

(56) References Cited

U.S. PATENT DOCUMENTS

| | | | | |
|---|---|---|---|---|
| 2003/0205763 | A1* | 11/2003 | Park | H01L 27/3246 257/359 |
| 2005/0161740 | A1* | 7/2005 | Park | H01L 27/3253 257/347 |
| 2006/0220056 | A1* | 10/2006 | Lee | H01L 27/3276 257/100 |
| 2010/0078627 | A1* | 4/2010 | Yoshinaga | H01L 27/3246 257/40 |
| 2010/0127265 | A1* | 5/2010 | Kim | H01L 29/41733 257/59 |
| 2013/0056735 | A1* | 3/2013 | Heo | H01L 51/5246 257/59 |

FOREIGN PATENT DOCUMENTS

| | | |
|---|---|---|
| CN | 102160185 A | 8/2011 |
| CN | 103474453 A | 12/2013 |
| CN | 203456466 U | 2/2014 |

OTHER PUBLICATIONS

English Translation of the International Search Report of PCT/CN2014/080898 published in English on Mar. 26, 2015.
Chinese Office Action of Chinese Application No. 201310436180.3, mailed May 18, 2015 with English translation.
Third Chinese Office Action of Chinese Application No. 201310436180.3, mailed Mar. 9, 2016 with English translation.
English translation of the International Preliminary Report on Patentability and Written Opinion of the International Searching Authority of PCT/CN2014/080898, issued Mar. 29, 2016.
Second Chinese Office Action of Chinese Application No. 201310436180.3, mailed Sep. 25, 2015 with English translation.

* cited by examiner

ELECTROLUMINESCENT DEVICE AND MANUFACTURING METHOD THEREOF

CROSS REFERENCE TO RELATED APPLICATIONS

This application is the National Stage of PCT/CN2014/080898 filed on Jun. 26, 2014, which claims priority under 35 U.S.C. §119 of Chinese Application No. 201310436180.3 filed on Sep. 23, 2014, the disclosure of which is incorporated by reference.

TECHNICAL FIELD

Embodiments of the present invention relate to an electroluminescent device and manufacturing method thereof.

BACKGROUND

An organic light-emitting diode (OLED), which also referred to as an organic electroluminescence display (OELD), has been widely applied into mobile communication terminal, personal digital assistant (PDA), handheld computer or the like recently due to its excellent characteristics such as self-luminescence, without requiring backlight, high contrast, thin in thickness, wide angle of view, fast response, broad service temperature, simple structure and manufacturing process.

As shown in FIG. 1, an active matrix OLED display device comprises a color film substrate 20 and an array substrate 10. The array substrate 10 comprises a substrate 11, and an array of thin film transistors 12, a protection layer 13 and a connection electrode 14 successively disposed on the substrate 11; wherein the connection electrode 14 is connected with a drain electrode of the thin film transistor 12 through a via hole of the protection layer. The color film substrate 20 comprises a second substrate 21, and a color filter layer (including a black matrix 221 and color retaining blocks 222R/G/B separated by the black matrix 221), a planarization layer 23, a first electrode 24, an organic light-emitting layer 25 and a second electrode 26 successively disposed on the second substrate 21. During manufacturing the OLED, the array substrate 10 and the color film substrate 20 are firstly formed respectively, then sealing frame glue is coated on edges of the array substrate 10 or the color film substrate 20; the array substrate 10 and the color film substrate 20 are assembled with each other so that the second electrodes 26 correspondingly contact with the connection electrodes 14 of the array substrate 10 one by one to achieve electric connection.

The connection electrode 14 is usually manufactured with a thicker thickness (typically 2-3 μm) so that the connection electrode 14 can sufficiently contact with the second electrode 26 after the assembling to improve the reliability of electric connection between the thin film transistor 12 and the second electrode 26; however, it would allow the process of forming the film to spend long time and the etching difficulty occurs in the process of etching the film to form the connection electrode 14.

SUMMARY

Embodiments of the present invention provide an electroluminescent device and manufacturing method thereof.

At least one embodiments of the present invention provide an electroluminescent device, which comprises a substrate. The array substrate comprises a substrate, and a thin film transistor, a protection layer and a connection electrode provided in turn on the substrate; wherein the protection layer covers the thin film transistor; the connection electrode is provided on the protection layer; the protection layer below the connection electrode protrudes towards a side away from the substrate to form a boss; the protection layer comprises a via hole disposed in a position corresponding to a drain electrode of the thin film transistor; the connection electrode is connected with the drain electrode of the thin film transistor through the via hole.

In an example, the via hole is provided in the boss

In an example, the via hole is provided on a side of the boss, and the connection electrode covers the boss and the via hole.

In an example, the connection electrode has a thickness of 0.3-1 μm.

In an example, the protection layer has a total thickness of 2-4 μm, a step of the boss has a height of 1.5-2.5 μm.

In an example, the connection electrode is formed of one or more of copper, molybdenum, tin, aluminum, silver.

In an example, the protection layer is formed of one or more of silicon nitride, silicon oxide or photosensitive resin.

In an example, the electroluminescent device further comprises a color film substrate. The color film substrate comprises a second substrate; and a color filter layer, a planarization layer, a first electrode, an organic light-emitting layer and a second electrode provided in turn on the second substrate; the second electrode contacts and is electrically connected with the connection electrode.

At least one embodiments of the present invention provide a method of manufacturing an electroluminescent device, which comprises a step of preparing a color film substrate, a step of preparing an array substrate, a step of assembling the color film substrate and the array substrate; wherein the step of preparing the array substrate comprises forming a thin film transistor on a substrate, forming a protection layer on the substrate having the thin film transistor, forming a boss at a preset position, at which a connection electrode is formed subsequently, by a pattern process and forming a via hole in a position of the protection layer corresponding to a drain electrode of the thin film transistor, and forming a connection electrode on the protection layer; wherein the connection electrode is connected with the drain electrode of the thin film transistor through the via hole of the protection layer.

In an example, the method uses multistage exposure process to form the boss at the preset position, at which the connection electrode is formed subsequently, by a pattern process and forming the via hole at the position of the protection layer corresponding to the drain electrode of the thin film transistor.

In an example, the method further comprises: coating photoresist on the protection layer; performing a multistage exposure process, and performing development to form a photoresist pattern on the protection layer; wherein in the photoresist pattern, a first thickness of photoresist is retained at the preset position, at which a connection electrode is formed subsequently; no photoresist is retained at the preset position, at which a via hole of the protection layer is formed subsequently, over the drain electrode of the thin film transistor; a second thickness of photoresist is retained on the region except the preset position of the connection electrode and the preset position of the via hole; the first thickness is greater than the second thickness; performing an etching process to remove the exposed protection layer, so as to form the via hole of the protection layer; performing an ashing process to remove the photoresist of the second thickness of region; performing an etching process to remove the exposed protection layer of the second thickness of region, so as to form a boss; and removing the photoresist remained on the first thickness of region.

In an example, the method further comprises: coating photoresist on the protection layer, using a first pattern process to form the boss at the preset position of the protection layer, at which the connection electrode is formed subsequently, and coating photoresist again, using a second pattern process to form the via hole at the preset position of the protection layer over the drain electrode of the thin film transistor.

In an example, the method further comprises: coating photosensitive resin on the substrate having the thin film transistor to form the protection layer; and performing a multistage exposure process and development or double exposures and developments to form the boss at the preset position of the protection layer, at which the connection electrode is formed subsequently, and to form the via hole at the preset position of the protection layer over the drain electrode of the thin film transistor.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "on," "under," or the like, are only used to indicate relative position relationship, and when the position of the object which is described is changed, the relative position relationship may be changed accordingly.

First Embodiment

Figure 1:
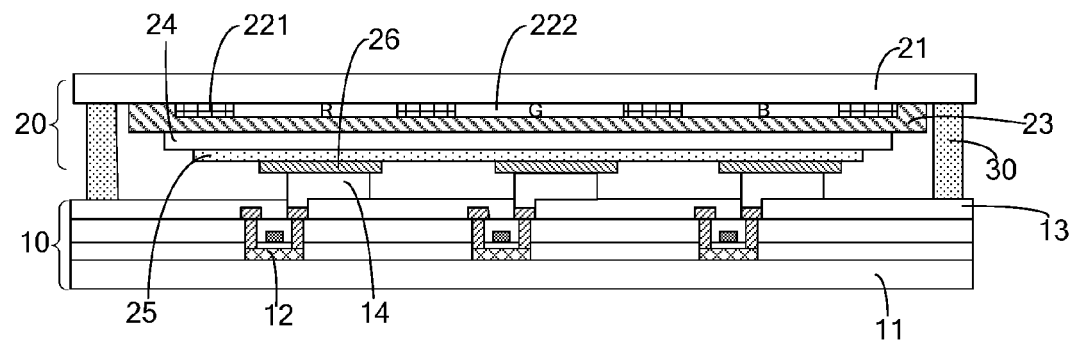
FIG. 1 is a schematic structural view of an active matrix OLED display device.
Figure 2A:
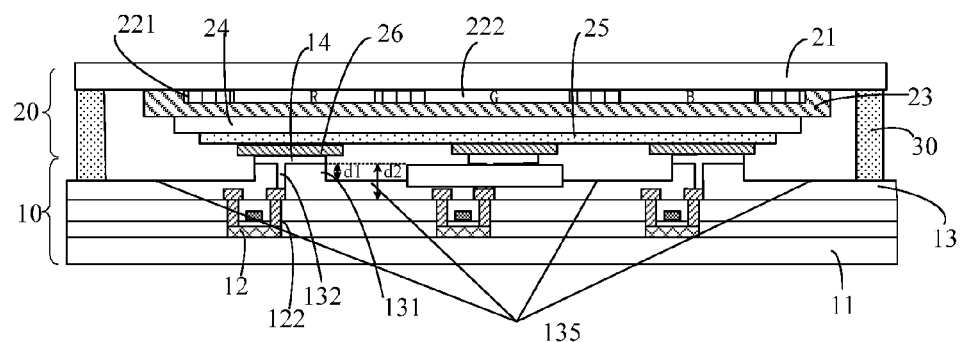
FIG. 2(a) is a schematic structural view of an electroluminescent display device according to a first embodiment of the present invention.
Figure 2B:
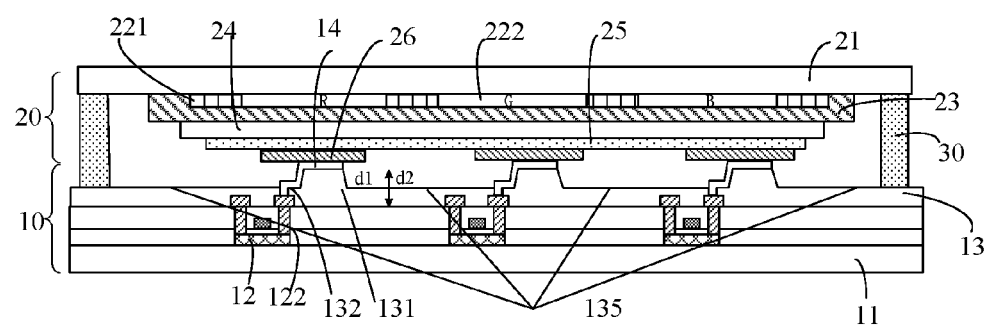
FIG. 2(b) is a schematic structural view of another electroluminescent display device according to a first embodiment of the present invention.

The embodiment of the present invention provides an electroluminescent device, as shown in FIGS. 2(a) and 2(b), which comprises an array substrate 10. The array substrate 10 comprises a substrate 11; and a thin film transistor 12, a protection layer 13 and a connection electrode 14 disposed in turn on the substrate 11. The protection layer 13 covers the thin film transistor 12; and the connection electrode 14 is disposed on the protection layer 13. The protection layer 13 below the connection electrode 14 protrudes towards a side away from the substrate 11 to form a boss 131. The protection layer 13 comprises a via hole 132 disposed in a position corresponding to a drain electrode 122 of the thin film transistor 12. The connection electrode 14 is connected with the drain electrode of the thin film transistor 12 through the via hole 132 of the protection layer.

A TFT circuit (drive circuit) is disposed on the array substrate 10 for driving and compensating the OLED. There are many ways of realizing the drive circuit, but the drive circuit comprises at least a drive thin film transistor. The thin film transistor 12 of the embodiment is the thin film transistor used to make driving in the drive circuit. The drain electrode 122 of the thin film transistor 12 is lead out through the connection electrode 14, and the connection electrode 14 contacts with a second electrode 26 of the OLED when the assembling procedure is performed, thereby to achieve the electrical connection between the drive circuit and the luminescent device.

It should be noted that the way of realizing the drive circuit has not direct relationship with the present invention, which does not affect the effect of the present invention. Therefore, the embodiments of the present invention do not limit the way of realizing the drive circuit, and it can be any realization way well known by those skilled in the art.

In the embodiment, the protection layer 13 below the connection electrode 14 is designed to be a boss; the connection electrode 14 is elevated to further reduce the thickness of the connection electrode 14, thereby to shorten the film formation time, reduce the etching difficulty and accordingly improve the production efficiency in the process of manufacturing the connection electrode. Meanwhile, the connection electrode 14 is elevated to improve the reliability of electrical connection between the thin film transistor 12 and the second electrode 26, and to avoid damaging the thin film transistor array due to the color film substrate 20 and the array substrate 10 squeezing or rubbing each other during and after the assembling procedure, thereby to improve the product yield.

FIG. 2(a) shows a first example of the embodiment. A via hole 132 of the protection layer is located in a boss 131; a connection electrode 14 is connected with a drain electrode 122 of the thin film transistor 12 through the via hole 132 of the protection layer below the connection electrode 14. In this case, the boss 131 overlaps with the drain electrode 122 of the thin film transistor 12 in position and is higher than all other parts 135 of the protection layer not under the connection electrode 14.

FIG. 2(b) shows a second example of the embodiment. A via hole 132 of a protection layer is disposed on one side of a boss 131; a connection electrode 14 covers the boss 131 and the via hole 132 of the protection layer. The connection electrode 14 is connected with a drain electrode 122 of a thin film transistor 12 through the via hole 132 of the protection layer below the connection electrode 14. In this case, the boss 131 does not overlap with the drain electrode 122 of the thin film transistor 12 in position and is higher than all other parts 135 of the protection layer not under the connection electrode 14.

The connection electrode 14 according to the present embodiment can be made of one or more of copper, molybdenum, tin, aluminum, silver. The connection electrode 14 has a thickness of 0.3-1 μm. Comparing with 2-3 μm of the thickness in the art, the thickness of the connection electrode 14 in the present embodiment has been greatly decreased, thereby the time for depositing the connection electrode is saved, and in subsequent etching processes, the process is simplified, the etching difficulty is reduced and the production efficiency is improved accordingly.

The protection layer 13 according to the present embodiment can be made of one or more of silicon nitride, silicon oxide or photosensitive resin. The protection layer 13 can be a single film layer formed of one material or a composite film layer formed of two or more materials as stated above. For example, a silicon nitride film layer is firstly formed, then a silicon oxide film layer is formed on the silicon nitride film layer, and the silicon nitride film layer and the silicon oxide film layer together constitute the protection layer 13. For example, the protection layer 13 is formed of photosensitive resin, and the exposure and development are performed to form the protection layer 13 with the boss 131 of the present embodiment. The photosensitive resin can be acrylic acid polymer based resin, polyimide based resin or polyamide based resin. For example, the formed protection layer 13 preferably has a total thickness of 2-4 μm; the boss 131 is formed by etching the protection layer 13, wherein the step height dl of the boss 131 is 1.5-2.5 μm.

For example, the electroluminescent device further comprises a color film substrate 20. The color film substrate 20 comprises a second substrate 21; and a color filter layer, a planarization layer 23, a first electrode 24, an organic light-emitting layer 15 and a second electrode 26 disposed in turn on the second substrate 21. The second electrode 26 contacts and is electrically connected with the connection electrode 14.

In the electroluminescent device according to embodiment of the present invention, the thickness of the connection electrode can be further decreased, so as to shorten the film formation time, reduce the etching difficulty and accordingly improve the production efficiency in the process of manufacturing the connection electrode. Meanwhile, the connection electrode is elevated to improve the reliability of electric connection between the thin film transistor and the second electrode, and to avoid damaging the thin film transistor array due to the color film substrate and the array substrate squeezing or rubbing each other during and after the assembling procedure, thereby to improve the product yield.

The electroluminescent display device according to the embodiment can be any products or components with display function, such as an electronic paper, a mobile phone, a tablet computer, a television, a display, a laptop computer, a digital photo frame and a navigator or the like.

Second Embodiment

Figure 3:
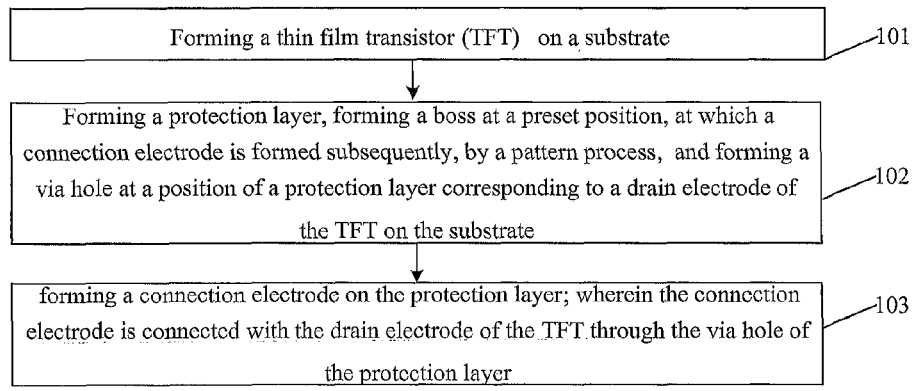
FIG. 3 is a diagram flow of manufacturing an array substrate of the electroluminescent display device according to a second embodiment of the present invention.

The embodiment of the present invention further provides a method of manufacturing an electroluminescent device. The manufacturing method comprises a step of preparing a color film substrate, a step of preparing an array substrate, a step of assembling the color film substrate and the array substrate. As shown in FIG. 3, the step of manufacturing the array substrate comprises: step 101, forming a thin film transistor 12 on a substrate 11; step 102, forming a protection layer 13 on the substrate 11 having the thin film transistor 12, and forming a boss 131 at a preset position, at which a connection electrode is formed subsequently, by a pattern process and forming a via hole 132 at a position of a protection layer corresponding to a drain electrode 122 of the thin film transistor 12; and step 103, forming a connection electrode 14 on the protection layer 13; wherein the connection electrode 14 is connected with the drain electrode of the thin film transistor 12 through the via hole 132 of the protection layer.

In combination with FIG. 2(a), in the step 101 of the embodiment, a TFT circuit (drive circuit) is formed on the substrate 11 for driving and compensating the OLED. However, the way of realizing the drive circuit has not direct relationship with the present invention, therefore, the embodiment is not repeated it here. The thin film transistor 22 is a drive thin film transistor in the drive circuit. The drain electrode of the thin film transistor 22 is lead out through the connection electrode 14. The connection electrode 14 contacts with the second electrode 26 of the OLED during the assembling procedure, so that the electrical connection between the drive circuit and the luminescent device is achieved. In the step 102, the protection layer 13 below the second electrode 26 is formed as a shape of a boss, so that the portion of the protection layer 13 below the second electrode 26 is higher than other portion of protection layer located at other position, so as to support the connection electrode 14. In the step 103, a thin layer of the connection electrode 14 is formed on the boss 131 (preferably, the thickness is 0.3-1 μm), which is connected with the thin film transistor 12 through the via hole 132 of the protection layer; the top surface of the connection electrode 14 contacts with the second electrode 26 after the assembling procedure is performed.

According to the manufacturing method of the embodiment, the protection layer 13 below the second electrode 26 is formed as a shape of a boss 131, and a thin layer of connection electrode 14 is formed on the boss 131 (preferably, the thickness of the connection electrode is 0.3-1 μm) so that the film formation time is shortened, the etching difficulty is reduced and accordingly the production efficiency is improved in the process of manufacturing the connection electrode. Meanwhile, the connection electrode is elevated to improve the reliability of electrical connection between the thin film transistor and the second electrode, and to avoid damaging the thin film transistor array due to the color film substrate and the array substrate squeezing or rubbing each other during and after the assembling procedure, thereby to improve the product yield.

According to a first example of the embodiment, in the step 102, during the procedure of forming the protection layer 13 having a boss 131, multistage exposure can be used to form the boss and the via hole 132 of the protection layer at the preset position, at which the connection electrode 14 is formed subsequently, so that the portion of the protection layer 13 below the second electrode 26 is higher than other portion of the protection layer located at other position, so as to support the connection electrode 14.

The multistage exposure process (that is, multi-tone mask process) refers to using a multi-tone mask to perform exposure after coating photoresist on the protection layer. Since the transmission intensities of different parts of the multi-tone mask are different, the exposure intensities of the different parts of photoresist are different; after the development is performed, the resulted photoresist patterns with different photoresist thickness can be obtained.

Figure 4:
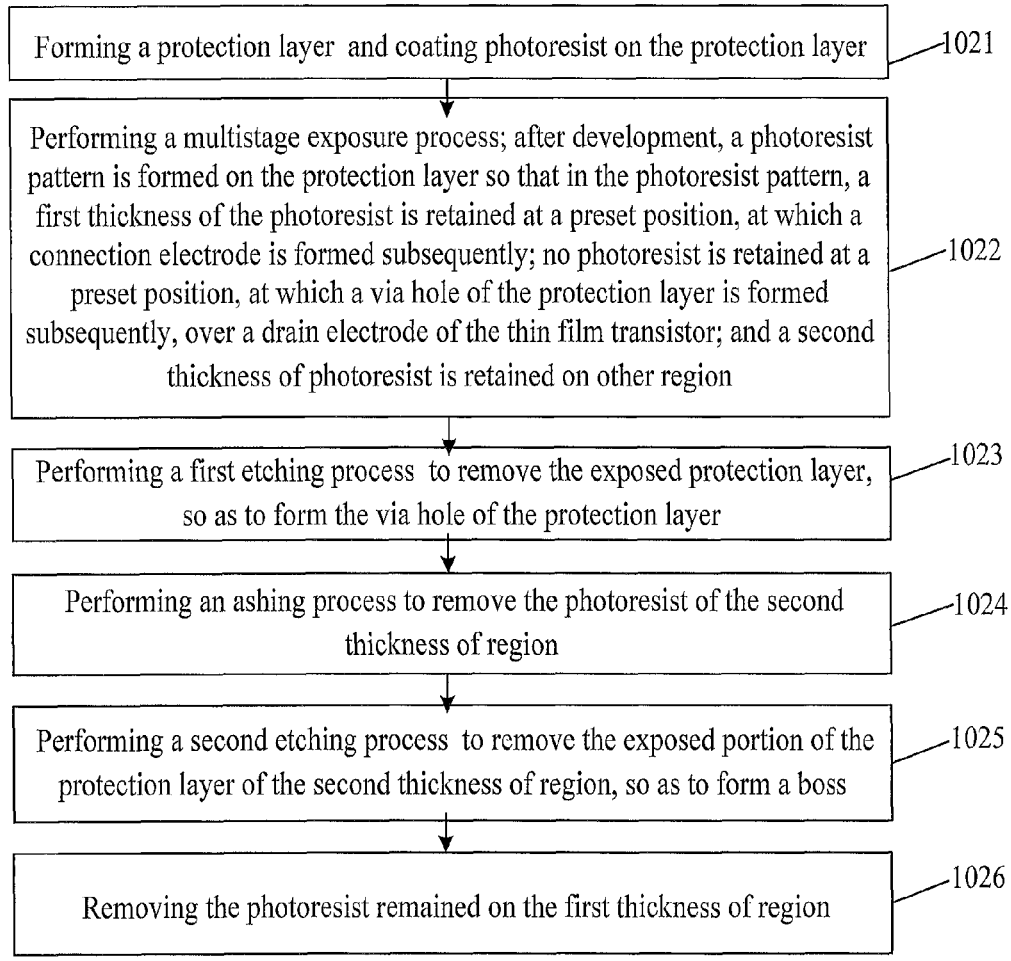
FIG. 4 is a diagram flow of multistage exposure process for forming the protection layer according to a second embodiment of the present invention.

As shown in FIG. 4 combined with 5(a)-5(f), the step 102 uses a multistage exposure process to form the boss 131 and the via hole 132 of the protection layer, which comprises following sub-steps.

Step 1021, the protection layer 13 is formed and the photoresist 40 is coated on the protection layer 13.

Figure 5A:
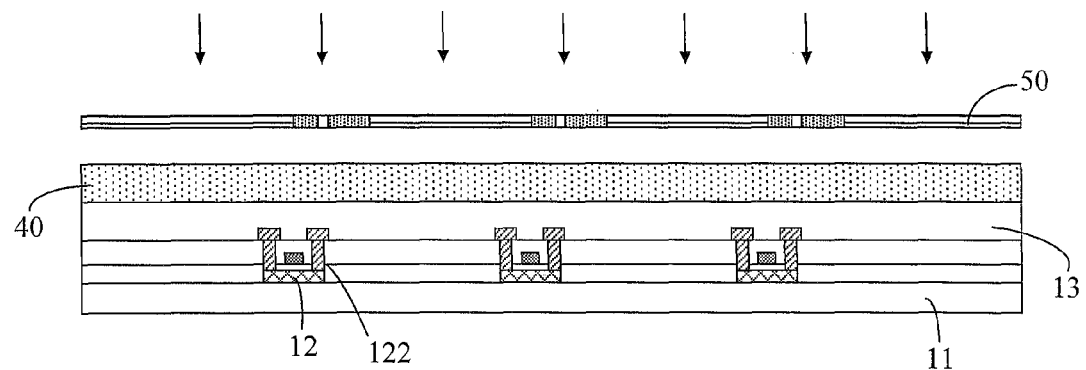
FIG. 5(a) is a schematic view of multistage exposure according to a second embodiment of the present invention.
Figure 5B:
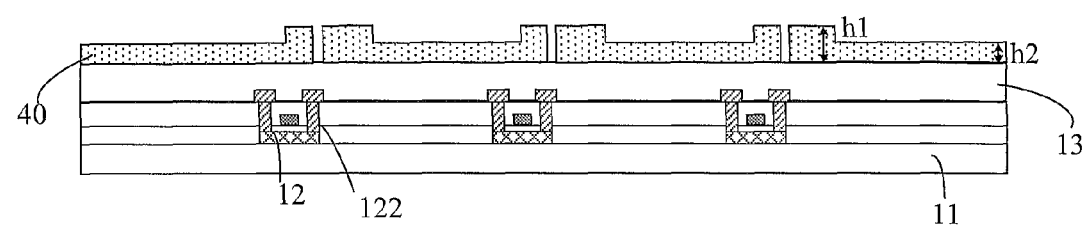
FIG. 5(b) is a schematic view of a photoresist pattern formed on the protection layer according to a second embodiment of the present invention.

Step 1022, as shown in FIGS. 5(a) and 5(b), a multi-tone mask 50 is used to perform a multistage exposure process. After development, a photoresist pattern is formed on the protection layer 13 so that in the photoresist pattern, a first thickness h1 of the photoresist is retained at a preset position, at which a connection electrode is formed subsequently; no photoresist is retained at a preset position, at which a via hole of the protection layer is formed subsequently, over a drain electrode of the thin film transistor; and a second thickness h2 of photoresist is retained on a region except the preset position of the connection electrode and the preset position of the via hole. The first thickness h1 is greater than the second thickness h2.

Figure 5C:
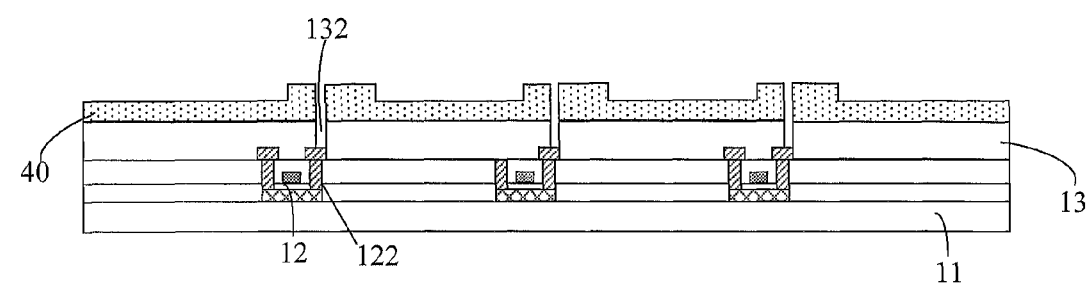
FIG. 5(c) is a schematic structural view of the array substrate after a first etching according to a second embodiment of the present invention.

Step 1023, a first etching process is performed to remove the exposed protection layer 13 at the preset position, at which the via hole of the protection layer is formed subsequently, so as to form the via hole 132 of the protection layer, as shown in FIG. 5(c).

Figure 5D:
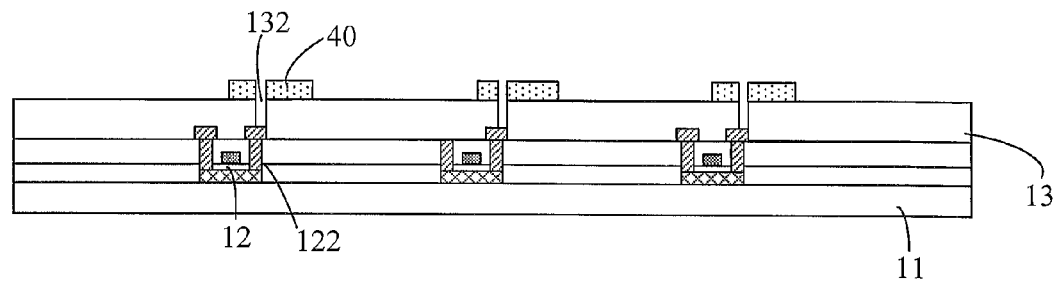
FIG. 5(d) is a schematic structural view of the array substrate after an ashing process according to a second embodiment of the present invention.

Step 1024, a first ashing process is performed to remove the photoresist of the second thickness of region, as shown in FIG. 5(d)

Figure 5E:
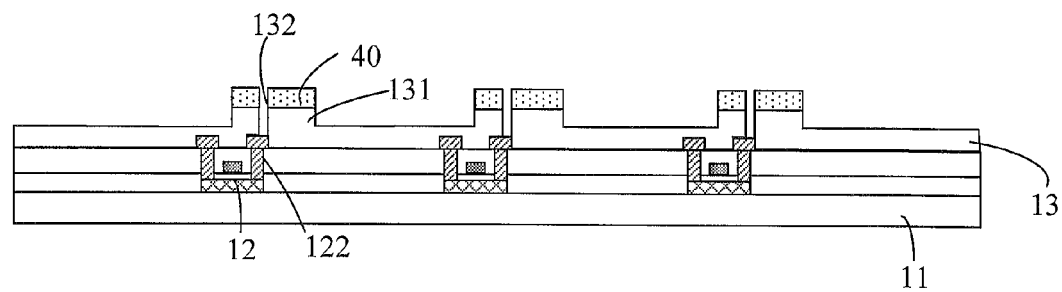
FIG. 5(e) is a schematic structural view of the array substrate after a second etching according to a second embodiment of the present invention.

Step 1025, a second etching process is performed to remove the exposed portion of the protection layer of the second thickness of region, so as to form a boss 131, as shown in FIG. 5(e).

Figure 5F:
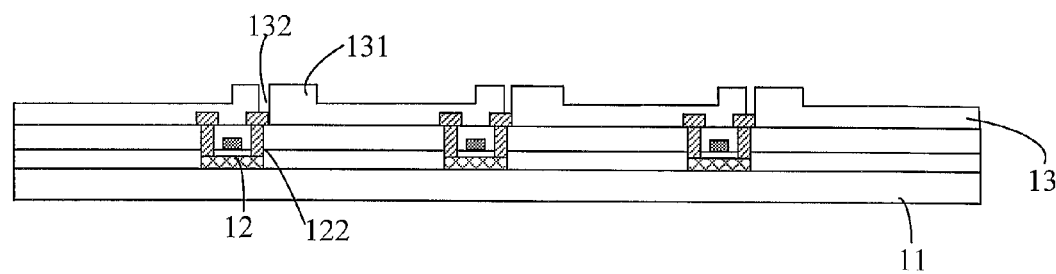
FIG. 5(f) is a schematic structural view of the array substrate after removing the remained photoresist according to a second embodiment of the present invention.

Step 1026, the photoresist remained on the first thickness of region is removed to finally form the protection layer with the boss 131 and the via hole 132, as shown in FIG. 5(f); and the via hole 132 of the protection layer is disposed over the drain electrode 122 of the thin film transistor 12.

In the example, the multi tone mask process is used, which reduces the number of pattern processes in the procedure of manufacturing the array substrate, thereby to effectively reduce fabrication cost and improve the product yield.

Figure 6A:
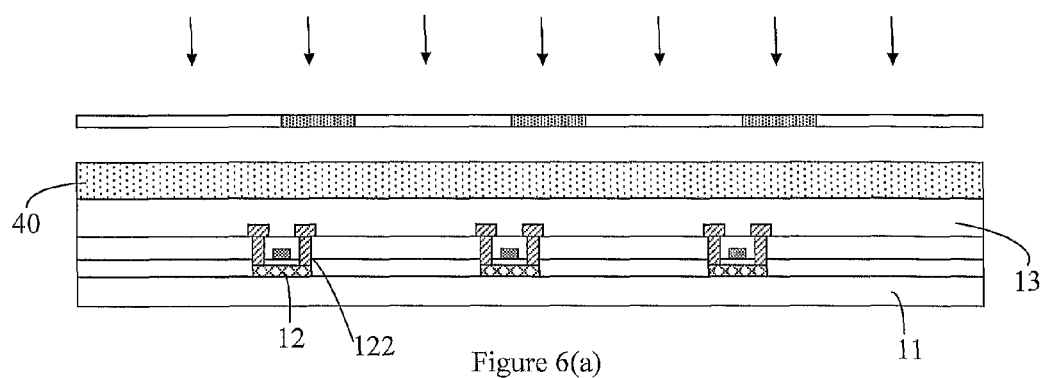
FIG. 6(a) is a schematic view of performing a regular mask exposure process according to a second embodiment of the present invention.
Figure 6B:
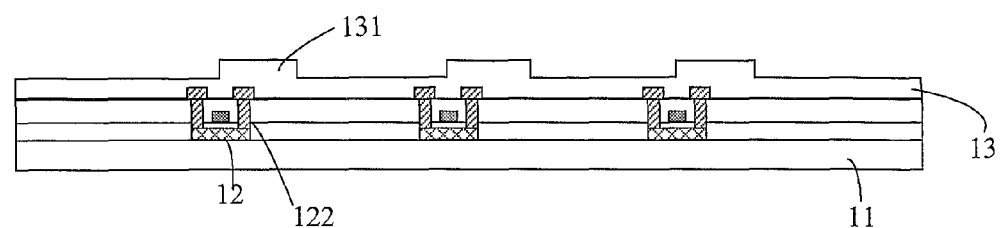
FIG. 6(b) is a schematic view of the array substrate after a first pattern process according to a second embodiment of the present invention.
Figure 6C:
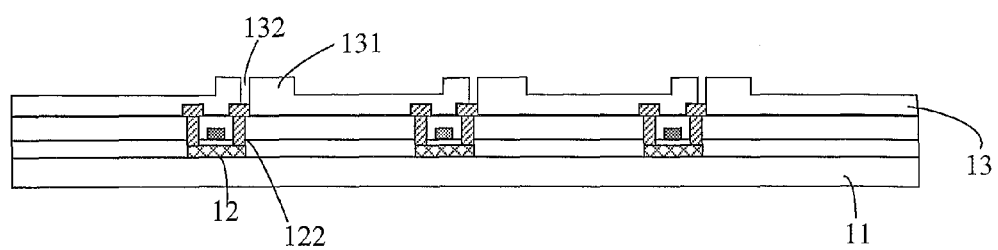
FIG. 6(c) is a schematic view of the array substrate after a second pattern process according to a second embodiment of the present invention.

In a second example of the embodiment, a regular mask can be used, but it needs two pattern processes. The second step comprises: step 1, forming a protection layer 13 on the substrate having the thin film transistor 12; step 2, coating photoresist 40 on the protection layer 13, using a pattern process to form a boss 131 at a preset position of the protection layer 13, at which a connection electrode is formed subsequently, as shown in FIGS. 6(a) and 6(b); and step 3, coating photoresist 40 again, using a second pattern process to form a via hole 132 at a preset position of the protection layer over a drain electrode of the thin film transistor, as shown in FIG. 6(c).

In above pattern process, a preset pattern is transferred to a certain film layer in the procedure of manufacturing semiconductor so that the film layer is patterned and presents a same pattern as the preset pattern. The pattern process includes, but not limited to ordinary photolithography process.

The protection layer 13 can be formed of one or more of silicon nitride, silicon oxide or photosensitive resin. In a third example of the embodiment, the protection layer 13 is formed of photosensitive resin, which does not need to be coated with photoresist, and can be directly exposed and developed, and the etching process is not needed after development. The second step comprises: step 1, coating photosensitive resin on the substrate having the thin film transistor to form the protection layer 13; step 2, performing a multistage exposure process and development or double exposures and developments to form the boss 131 at the preset position of the protection layer, at which the connection electrode is formed subsequently, and to form the via hole at the preset position of the protection layer over the drain electrode 122 of the thin film transistor 12.

In step 2, the protection layer 13 is directly exposed by a multistage exposure process and developed to form the protection layer 13 having the boss 13 and the via hole 132 of the protection layer. The double exposures and developments process omits all steps of coating photoresist, and directly performs exposures and developments, and the etching process is not needed after development. For the particular procedures, please refer to the second example.

The above steps can form the array substrate as shown in FIGS. 2(a) and 2(b), which only differs in that the masks used in the procedure of forming the protection layer 13 are different, such as the position and shape of the boss or the like.

According to the method of manufacturing the electroluminescent device provided by embodiments of the present invention, the protection layer below the connection electrode is designed as a shape of a boss, and the connection electrode is elevated to further reduce the thickness of the connection electrode, thereby to shorten the film formation time, decrease the etching difficulty and accordingly improve the production efficiency in the process of manufacturing the connection electrode. Meanwhile, the connection electrode is elevated to improve the reliability of electrical connection between the thin film transistor and the second electrode, and to avoid damaging the thin film transistor array due to the color film substrate and the array substrate squeezing or rubbing each other during and after the assembling procedure, thereby to improve the product yield.

According to the electroluminescent device and manufacturing method thereof provided by embodiments of the present invention, the protection layer below the connection electrode is designed as a shape of a boss, and the connection electrode is elevated to further decrease the thickness of the connection electrode (the thickness of the connection electrode can be reduced to 0.3-1 μm in the present invention), thereby to shorten the film formation time, reduce the etching difficulty and accordingly improve the production efficiency in the process of manufacturing the connection electrode. Meanwhile, the connection electrode is elevated to improve the reliability of electrical connection between the thin film transistor and the second electrode, and to avoid damaging the thin film transistor array due to the color film substrate and the array substrate squeezing or rubbing each other during and after the assembling procedure, thereby to improve the product yield.

It should be noted that the technical features of the embodiments can be used in any combination unless they are conflicted with each other.

It should be understood that the described above are only illustrative embodiments and implementations for explaining the present invention, and the present invention is not intended to limited thereto. For one of ordinary skill in the art, various modifications and improvements easily conceived shall fall within the protection scope of the present invention. The scope protected by the present invention is defined by the claims.

The present application claims priority of Chinese patent application No. 201310436180.3 filed on Sep. 23, 2013 titled "electroluminescent device and manufacturing method thereof", the contents of which are incorporated herein by reference.

What is claimed is:

1. An electroluminescent device, comprising an array substrate;
wherein the array substrate comprises a substrate, and a thin film transistor, a protection layer and a connection electrode provided in turn on the substrate;
the protection layer covers the thin film transistor; the connection electrode is provided on the protection layer; and
the protection layer below the connection electrode protrudes towards a side away from the substrate to form a boss, the boss being higher than other parts of the protection layer not under the connection electrode; the protection layer comprises a via hole provided in a position corresponding to a drain electrode of the thin film transistor; and the connection electrode connects with the drain electrode of the thin film transistor through the via hole.

2. The electroluminescent device according to claim 1, wherein the via hole of the protection layer is provided in the boss.

3. The electroluminescent device according to claim 2, wherein the via hole of the protection layer is provided on one side of the boss, and the connection electrode covers the boss and the via hole of the protection layer.

4. The electroluminescent device according to claim 2, wherein the connection electrode has a thickness of 0.3-1 μm.

5. The electroluminescent device according to claim 4, wherein the protection layer has a total thickness of 2-4 μm, and a step of the boss has a height of 1.5-2.5 μm.

6. The electroluminescent device according to claim 1, wherein the via hole of the protection layer is provided on one side of the boss, and the connection electrode covers the boss and the via hole of the protection layer.

7. The electroluminescent device according to claim 6, wherein the connection electrode has a thickness of 0.3-1 μm.

8. The electroluminescent device according to claim 6, wherein the protection layer has a total thickness of 2-4 μm, and a step of the boss has a height of 1.5-2.5 μm.

9. The electroluminescent device according to claim 1, wherein the connection electrode has a thickness of 0.3-1 μm.

10. The electroluminescent device according to claim 9, wherein the protection layer has a total thickness of 2-4 μm, and a step of the boss has a height of 1.5-2.5 μm.

11. The electroluminescent device according to claim 1, wherein the protection layer has a total thickness of 2-4 μm, and a step of the boss has a height of 1.5-2.5 μm.

12. The electroluminescent device according to claim 1, wherein the connection electrode is formed of one or more of copper, molybdenum, tin, aluminum, or silver.

13. The electroluminescent device according to claim 1, wherein the protection layer is formed of one or more of silicon nitride, silicon oxide or photosensitive resin.

14. The electroluminescent device according to claim 1, further comprising a color film substrate;
wherein the color film substrate comprises a second substrate; and a color filter layer, a planarization layer, a first electrode, an organic light-emitting layer and a second electrode are provided in turn on the second substrate; and the second electrode contacts and is electrically connected with the connection electrode.

15. A method of manufacturing an electroluminescent device, comprising a step of preparing a color film substrate, a step of preparing an array substrate, a step of assembling the color film substrate and the array substrate; wherein the step of preparing the array substrate comprises:
forming a thin film transistor on a substrate;
forming a protection layer on the substrate with the thin film transistor;
forming a boss at a preset position, at which a connection electrode is formed subsequently, by a pattern process and forming a via hole at a position of the protection layer corresponding to a drain electrode of the thin film transistor, to allow the boss being higher than other parts of the protection layer not under the connection electrode; and
forming the connection electrode on the protection layer; wherein the connection electrode is connected with the drain electrode of the thin film transistor through the via hole of the protection layer.

16. The manufacturing method according to claim 15, wherein a multistage exposure process is used to form the boss at the preset position, at which the connection electrode is formed subsequently, and the via hole at the position of the protection layer corresponding to the drain electrode of the thin film transistor.

17. The manufacturing method according to claim 16, further comprising:
coating photoresist on the protection layer;

performing the multistage exposure process and development to form a photoresist pattern on the protection layer; wherein in the photoresist pattern, a first thickness of photoresist is retained at the preset position, at which the connection electrode is formed subsequently; and no photoresist is retained at the preset position, at which the via hole of the protection layer is formed subsequently, over the drain electrode of the thin film transistor; a second thickness of photoresist is retained on the region except the preset position of the connection electrode and the preset position of the via hole; and the first thickness is greater than the second thickness;

performing an etching process to remove the exposed protection layer, so as to form the via hole of the protection layer;

performing an ashing process to remove the photoresist of the second thickness of region;

performing an etching process to remove the exposed protection layer of the second thickness of region, so as to form the boss; and removing the photoresist remained on the first thickness of region.

18. The manufacturing method according to claim 15, further comprising:

coating photoresist on the protection layer, using a pattern process to form the boss at the preset position of the protection layer, at which the connection electrode is formed subsequently; and coating photoresist again, using a pattern process again to form the via hole at the preset position of the protection layer over the drain electrode of the thin film transistor.

19. The manufacturing method according to claim 15, further comprising:

coating photosensitive resin on the substrate with the thin film transistor to form the protection layer; and performing a multistage exposure process and development or double exposures and developments to form the boss at the preset position of the protection layer, at which the connection electrode is formed subsequently, and to form the via hole at the position of the protection layer over the drain electrode of the thin film transistor.

* * * * *